United States Patent [19]
Aoshima

[11] Patent Number: 6,068,963
[45] Date of Patent: May 30, 2000

[54] NEGATIVE-TYPE IMAGE RECORDING MATERIALS

[75] Inventor: Keitaro Aoshima, Shizuoka-ken, Japan

[73] Assignee: Fuji Photo Film Co., Ltd., Minami-Ashigara, Japan

[21] Appl. No.: 09/008,487

[22] Filed: Jan. 16, 1998

[30] Foreign Application Priority Data

Jan. 20, 1997 [JP] Japan ..................................... 9-007532
Feb. 24, 1997 [JP] Japan ..................................... 9-039019

[51] Int. Cl.⁷ ...................................................... G03F 7/038
[52] U.S. Cl. ........................ 430/270.1; 430/914; 430/926; 430/927
[58] Field of Search .............................. 430/270.1, 287.1, 430/914, 926, 927

[56] References Cited

U.S. PATENT DOCUMENTS

| | | | |
|---|---|---|---|
| 4,444,868 | 4/1984 | Ichimura | 430/285 |
| 5,304,456 | 4/1994 | Ueda et al. | 430/270 |
| 5,372,907 | 12/1994 | Haley et al. | 430/157 |
| 5,491,046 | 2/1996 | DeBoer et al. | 430/302 |
| 5,506,089 | 4/1996 | Gybin et al. | 430/287 |
| 5,876,899 | 3/1999 | Szmanda et al. | 430/273.1 |

FOREIGN PATENT DOCUMENTS

| | | |
|---|---|---|
| 0 672954 A2 | 3/1995 | European Pat. Off. . |
| 0 795789 A1 | 9/1997 | European Pat. Off. . |
| 0 823659 A1 | 2/1998 | European Pat. Off. . |
| WO98/21038 | 5/1998 | WIPO . |

*Primary Examiner*—Janet Baxter
*Assistant Examiner*—Rosemary Ashton
*Attorney, Agent, or Firm*—Burns, Doane, Swecker & Mathis, LLP

[57] ABSTRACT

The present invention provides a negative-type image recording material which does not smudge non-image portions during printing, which provides excellent film strength of recorded image portions, and which exhibits press life. Particularly when the material is used for recording with a variety of laser devices that emit infrared rays, the material enables direct plate making from computer digital data. The negative-type image recording material of the invention contains (A) a polymer having a heterocyclic group containing an unsaturated bond therein, (B) a cross-linking agent that cross-links with the aid of an acid, and (C) a compound that generates an acid upon exposure to light or heat.

19 Claims, No Drawings

NEGATIVE-TYPE IMAGE RECORDING MATERIALS

BACKGROUND OF THE INVENTION

1. Field of the Invention

The present invention relates to image recording materials which may be used as planographic printing plate materials, color proofs, dry lith type film, photo resists, or color filters. More particularly, the present invention relates to image recording materials which can be used as planographic printing plate materials which allow direct plate making by manipulation of infrared laser beams based on digital signals from a computer, etc.

2. Description of the Related Art

Conventional apparatus for carrying out direct plate making from digital computer data include those making use of (1) electrophotography, (2) a photopolymerization system that uses a laser that emits blue or green light, (3) deposition of a silver salt on a light-sensitive resin, and (4) a silver salt diffusion transfer method.

However, apparatus employing (1) electrophotography is disadvantageous in that it requires intricate processes such as charging, exposure, and development for forming images, thus making the apparatus complex and large. An apparatus based on (2) photopolymerization involves use of a plate material which is highly sensitive to blue or green light, and therefore, such material cannot be easily handled in a lighted room. Methods (3) and (4) employ a silver salt, which has the drawbacks of requiring cumbersome processes for development, etc. and generating waste solution that contain silver.

Progress of laser technology in recent years has been amazing. Particularly with respect to solid-state lasers and semiconductor lasers that emit infrared rays having a wavelength of 760 nm–1200 nm, high output and compact laser devices have become readily available. Laser devices of these types are very useful as light sources for recording when direct plate making is performed through use of digital data from a computer, etc. However, since many photosensitive recording materials which are useful in practice are sensitive to wavelengths in the visible range of 760 nm or less, images cannot be recorded with these infrared laser devices. Therefore, there is need for materials capable of forming images with an infrared laser device.

As for image recording materials that can be used for recording with infrared laser devices, U.S. Pat. No. 4,708,925 discloses recording materials containing an onium salt, a phenol resin, and a spectral sensitizer. The recording materials disclosed in that patent permit recording not only with infrared lasers but also with UV rays or visible rays through varying the spectral sensitizer materials. These image recording materials are of the positive type and make use of the effect of the onium salt and phenol resin to inhibit dissolution into the developing solution. On the other hand, U.S. Pat. No. 5,372,907 discloses negative-type image recording materials containing an onium salt, a resol resin, a novolac resin, and an infrared absorber. These image recording materials are of the positive type when exposed to infrared laser rays or UV rays; however, after heat treatment following exposure, they provide negative images.

Plate materials for printing using the aforementioned image recording materials are problematic in that they tend to become smudged during printing. Moreover, with plate materials for printing using these image recording materials, film strength at image portions is insufficient, resulting in poor press life.

SUMMARY OF THE INVENTION

Accordingly, an object of the present invention is to provide a negative-type image recording material which does not smudge non-image portions during printing.

Another object of the present invention is to provide a negative-type image recording material which has excellent image film strength and excellent press life.

Still another object of the present invention is to provide a negative-type image recording material capable of direct plate making from digital data of computers, etc. through recording by use of an infrared-emitting solid-state laser or semiconductor laser.

The present inventors conducted extensive studies focusing on the constituents of negative-type image recording materials, and found that the above-described objects can be achieved by use of a polymer having a heterocyclic group as a binder, leading to completion of the invention.

Accordingly, the present invention is directed to a negative-type image recording material comprising (A) a polymer having a heterocyclic group containing an unsaturated bond therein, (B) a cross-linking agent that cross-links with the aid of an acid (hereinafter simply referred to as "cross-linking agent"), and (C) a compound that generates an acid upon exposure to light or heat (hereinafter simply referred to as an "acid-generating agent").

In the negative-type image recording material of the present invention, the acid-generating agent (C) decomposes to generate acid, which acid in turn promotes the activity of the cross-linking agent (B) to induce a cross-linking reaction with a polymer (A) having a heterocyclic group containing an unsaturated bond therein, to effect plate making of the image material; or in other words, image recording. Through use of a polymer having a heterocyclic group, it is possible to dramatically improve the efficiency of the cross-linking reaction while maintaining excellent solubility of the film in the developing solution.

DETAILED DESCRIPTION OF THE INVENTION

The present invention will next be described in detail with regard to respective components.

(A) Polymer having a Heterocyclic Group Containing an Unsaturated Bond therein

In the present invention, a heterocycle denotes a ring containing at least one species of hetero atom other than carbon in the atom constituting a ring system. As a usable hetero atom, a nitrogen atom, an oxygen atom, a sulfur atom, and a silicon atom are preferred. By use of a polymer having such a heterocyclic group, excellent effects of the present invention are obtained. The reason for this may be that the chemical structure of a heterocycle containing a lone pair enhances reactivity of the polymer.

A heterocycle containing an unsaturated bond therein preferably used in the present invention (hereinafter simply referred to as "heterocycle") is a 5-membered heterocyclic ring having two conjugated double bonds, a 6-membered heterocyclic ring having three conjugated double bonds, or a condensed heterocyclic ring thereof. These heterocycles are called aromatic heterocycles, due to their aromaticity. Moreover, a heterocycle obtained from condensing the above-mentioned heterocycle with an aromatic hydrocarbon ring such as a benzene ring and a naphthalene ring is particularly preferred.

Examples of the heterocycle preferably used in the present invention include monocyclic heterocycles such as pyrrole, furan, thiophene, oxazole, isoxazole, thiazole, isothiazole, imidazole, pyrazole, furazane, oxadiazole, pyridine, pyridazine, pyrimidine, pyrazine, triazine, and silabenzene; and condensed heterocycles such as indole, isoindole, benzofuran, benzothiophene, indolidine, quinoline, isoquinoline, purine, indazole, benzoimidazole, benzothiazole, benzoxazole, quinazoline, cinnoline, quinoxaline, phthalazine, pteridine, carbazole, acridine, phenanthridine, xanthene, phenazine, and phenothiazine. These heterocycles may have substituents. Examples of preferred substituents include a hydrocarbon group having 20 or less carbon atoms, an alkoxyl group having 20 or less carbon atoms, an aryloxy group having 20 or less carbon atoms, and a halogen atom.

In the present invention, a polymer containing a heterocyclic group is used. Although the heterocyclic group may be introduced in the polymer as a constituent component of a main chain thereof, the group bonded to a side chain thereof in a pendant-like manner is preferred since it provides high film strength of image-bearing portions. In this case, the heterocyclic group may be directly bonded to a polymer main chain and, preferably, may be bonded in a pendant-like manner via an appropriate linkage chain in view of high film strength of an image portion. Examples of the linkage chain include an ester linkage, a carboxylic amide linkage, a sulfonic amide linkage, an ether linkage, a thioether linkage, and an organic group having 20 or less carbon atoms and optionally containing these linkages. Examples of the polymer main chain include vinyl polymers such as poly(metha)acrylate, polystyrene, and polyvinyl acetal; polyester; and polyurethane; with vinyl polymers being preferred in view of their availability and economic advantages.

The polymer containing a heterocyclic group preferably used in the present invention has a structure represented by formula (I):

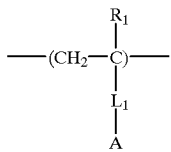

(I)

wherein $R_1$ represents a hydrogen atom or a methyl group; $L_1$ represents a single bond, an ester linkage, a carboxylic amide linkage, a sulfonic amide linkage, an ether linkage, a thioether linkage, or a divalent organic group having 20 or less carbon atoms and optionally containing these linkages; and A represents a heterocycle.

The polymer having a structure represented by formula (I) is prepared through conventional radical polymerization of the corresponding monomer represented by formula (II), wherein a notation identical to that in formula (I) represents the same group as in formula (I).

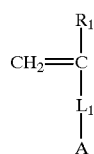

(II)

Of the polymers having a structure represented by formula (I), particularly preferred ones in the present invention are those having a structure represented by any of formulas (III) to (V):

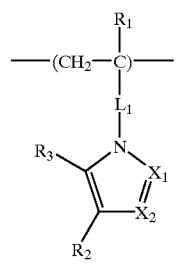

(III)

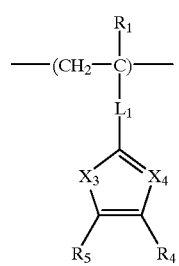

(IV)

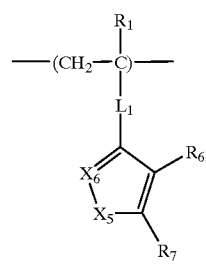

(V)

wherein $R_1$ represents a hydrogen atom or a methyl group; $L_1$ represents a single bond, an ester linkage, a carboxylic amide linkage, a sulfonic amide linkage, an ether linkage, a thioether linkage, or a divalent organic group having 20 or less carbon atoms and optionally containing these linkages; and each of $R_2$ to $R_7$, which may be identical to or different from one another, represents a hydrogen atom or an organic group having 20 or less carbon atoms and optionally containing a substituent. The organic group may contain a heteroatom such as a nitrogen atom, an oxygen atom, or a sulfur atom. Each pair of $R_2$ and $R_3$, $R_4$ and $R_5$, and $R_6$ and $R_7$ may be combined to form a condensed ring. Examples of preferable substituents include a halogen atom, an alkoxy group having 10 or less carbon atoms, and an aryloxy group having 10 or less carbon atoms.

Each of $X_1$ and $X_2$, which may be identical to or different from each other, represents a nitrogen atom or C-$R_{11}$. $R_{11}$ represents a hydrogen atom or a hydrocarbon group having 20 or less carbon atoms. $X_3$ represents N-$R_{12}$, an oxygen atom, or a sulfur atom. $R_{12}$ represents a hydrogen atom or a hydrocarbon group having 20 or less carbon atoms. $X_4$ represents a nitrogen atom or C-$R_{13}$, wherein $R_{13}$ represents a hydrogen atom or a hydrocarbon group having 20 or less carbon atoms. $X_5$ represents N-$R_{14}$, an oxygen atom, or a sulfur atom. $R_{14}$ represents a hydrogen atom or a hydrocarbon group having 20 or less carbon atoms. $X_6$ represents a nitrogen atom or C-$R_{15}$. $R_{15}$ represents a hydrogen atom or a hydrocarbon group having 20 or less carbon atoms.

Polymers having structures represented by formulas (III) to (V) are obtained by use of conventional radical polymerization methods from corresponding monomers represented by formulas (VI) to (VIII). Notations in formulas (VI) to (VIII) identical to those in formulas (III) to (V) represent the same groups as in formulas (III) to (V).

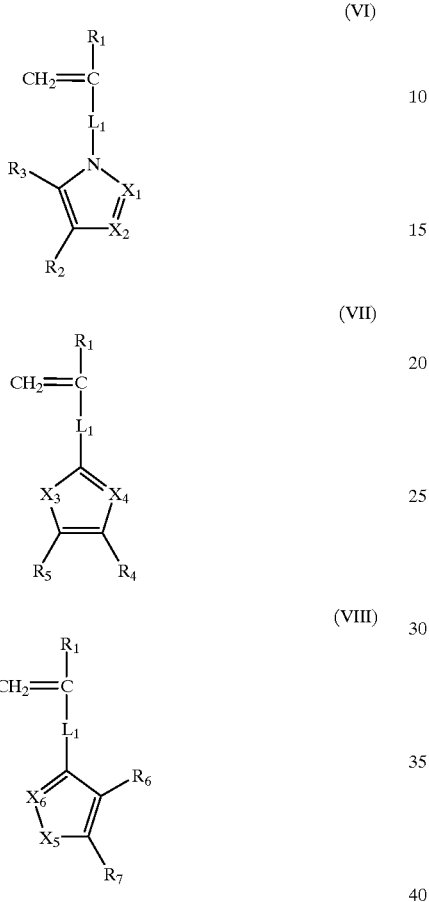

Examples of the monomers of formulas (VI) to (VIII) which are preferably used in the present invention are listed below.

In the formulas, $R_1$ represents a hydrogen atom or a methyl group; $Y_1$ represents an oxygen atom or NH; and n represents an integer between 1 and 20 inclusive.

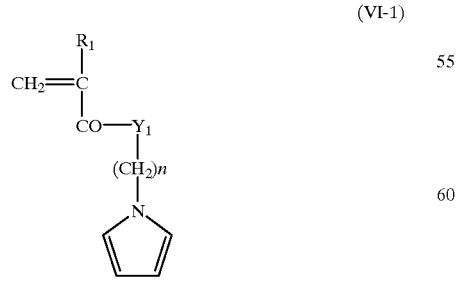

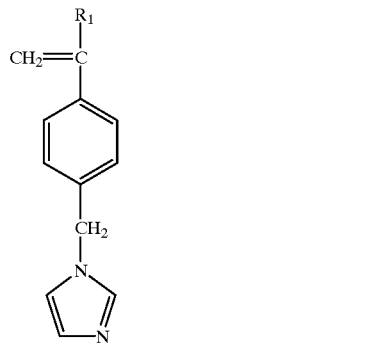

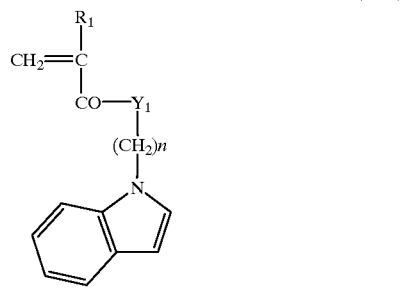

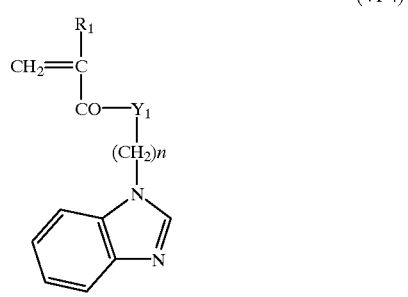

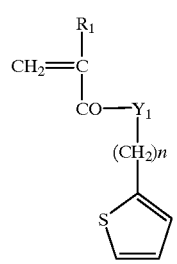
(VII-2)
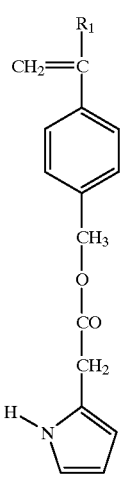
(VII-3)
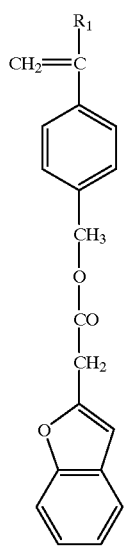
(VII-4)
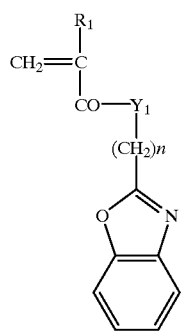
(VII-5)
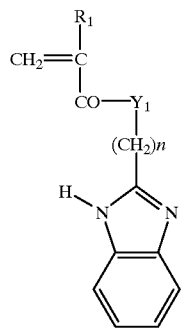
(VII-6)
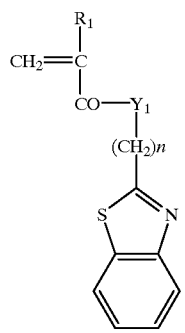
(VII-7)
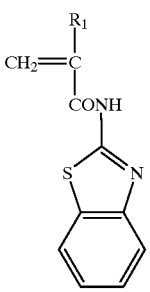
(VII-8)

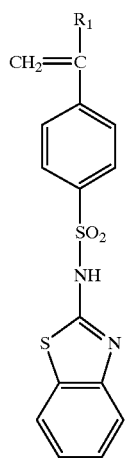
(VII-9)
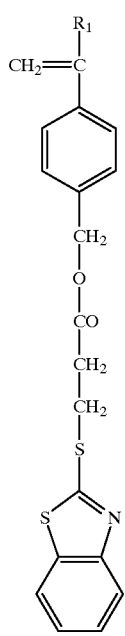
(VII-10)
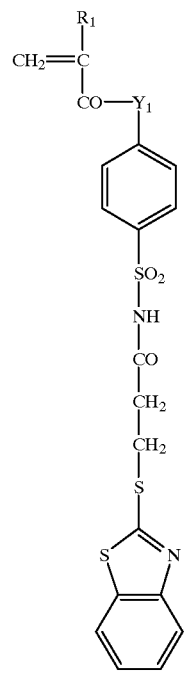
(VII-11)
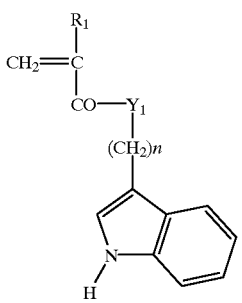
(VIII-1)
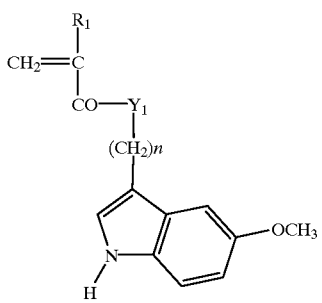
(VIII-2)

-continued

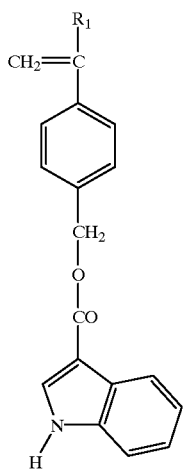

(VIII-3)

Of these monomers, monomer (VI-3) having one condensed benzene ring is particularly preferred, since it provides favorable film strength at the image portion as compared with a monomer having no benzene-condensed ring, and favorable solubility in a developer as compared with a monomer having a ring condensed with two benzene rings.

In the present invention, a polymer obtained through radical polymerization of at least one of the monomers represented by formulas (VI) to (VIII) is preferably used. Both a homopolymer obtained from one of the monomers represented by formulas (VI) to (VIII) and a copolymer obtained from two or more of the monomers may be used.

In the present invention, more preferred polymers are copolymers obtained through radical polymerization of at least one of the monomers represented by formulas (VI)–(VIII) and a monomer having an acidic functional group such as carboxyl group. In order to obtain enhanced developability by the use of water or an aqueous alkaline solution, an acidic group is preferably introduced into the polymer. Examples of the acidic functional group include COOH, —CONHCO—, —CONHSO$_2$—, —SO$_2$NH—, and a phenolic OH. If these acidic functional groups are already present in the monomers of formulas (VI) to (VIII), then there is no need to copolymerize such monomers with other monomers having acidic functional groups.

Examples of monomers having an acidic functional group include acrylic acid, methacrylic acid, itaconic acid, maleic acid, N-(2-carboxyethyl)acrylamide, N-(2-carboxyethyl)methacrylamide, N-(carboxyphenyl)acrylamide, N-(carboxyphenyl)methacrylamide, carboxystyrene, maleimide, N-(phenylsulfonyl)acrylamide, N-(phenylsulfonyl)methacrylamide, N-(tolylsulfonyl)acrylamide, N-(tolylsulfonyl)methacrylamide, N-(chlorophenylsulfonyl)acrylamide, N-(chlorophenylsulfonyl)methacrylamide, N-(sulfamoylphenyl)acrylamide, N-(sulfamoylphenyl)methacrylamide, N-(methylsulfamoylphenyl)acrylamide, N-(methylsulfamoylphenyl)methacrylamide, N-(phenylsulfamoylphenyl) acrylamide, N-(phenylsulfamoylphenyl)methacrylamide, N-(tolylsulfamoylphenyl)acrylamide, N-(tolylsulfamoylphenyl)methacrylamide, N-[(chlorophenylsulfamoyl)phenyl]acrylamide, N-[(chlorophenylsulfamoyl)phenyl]methacrylamide, N-(hydroxyphenyl)acrylamide, N-(hydroxyphenyl)methacrylamide, N-(hydroxynaphthyl)acrylamide, and N-(hydroxynaphthyl)methacrylamide.

The following monomers having a strong acid salt moiety (though having no acidic functional groups) are also preferred as structural components of a copolymer as they improve solubility in water and, consequently, enhance developability of an image recording material when an aqueous developer is used: sodium p-styrenesulfonate, an alkali metal salt of 2-acrylamide-2-methylpropaneanesulfonic acid, a tetraalkylammonium salt, and potassium 3-sulfopropylacrylate.

Other than these acidic-functional-group-containing monomers and salt-containing monomers, conventional monomers may be copolymerized as desired. Examples of the conventional monomers include acrylate esters such as methyl acrylate, ethyl acrylate, propyl acrylate, butyl acrylate, 2-ethylhexyl acrylate, cyclohexyl acrylate, 2-hydroxyethyl acrylate, and benzyl acrylate; methacrylate esters such as methyl methacrylate, ethyl methacrylate, propyl methacrylate, butyl methacrylate, 2-ethylhexyl methacrylate, cyclohexyl methacrylate, 2-hydroxyethyl methacrylate, and benzyl methacrylate; and acrylonitrile.

The ratio of the structural unit represented by formulas (III), (IV), or (V) contained in a copolymer obtained from these monomers is preferably 20–100% by weight, more preferably 30–95% by weight.

The weight average molecular weight of a polymer used in the present invention is preferably 5,000 or more, more preferably 10,000–300,000, and the number average molecular weight thereof is preferably 1,000 or more, more preferably 2,000–250,000. The polydispersion degree (weight average molecular weight/number average molecular weight) of the polymer preferably falls within the range from 1.1 to 10.

These polymers, which may be random polymers, block polymers, graft polymers, etc., are preferably random polymers.

Examples of a useful solvent in the preparation of a polymer used in the present invention include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformaide, N,N-dimethylacetamide, toluene, ethyl acetate, methyl lactate, ethyl lactate, dimethyl sulfoxide, and water. These solvents may be used singly or in combination of two or more species.

As to the radical polymerization initiator employed in the preparation of a polymer used in the present invention, a conventional compound such as an azo-type initiator, a peroxide initiator, etc. may be used.

In the present invention, the polymer may be used singly or as a mixture. These polymers are added to an image recording material in an amount of 20–95% by weight, preferably 40–90% by weight, based on the total weight of the solid components. If the amount is less than 20% by weight, the strength of an image-bearing portion after images are formed becomes insufficient, whereas if it is more than 95% by weight, images cannot be formed.

(B) Cross-linking Agent

Cross-linking agents suitably used in the present invention have two or more hydroxymethyl groups, alkoxymethyl groups, epoxy groups, or vinyl ether groups in the molecule. Preferably, these cross-linkable functional groups directly bond to the aromatic ring. Specifically, mention may be made of methylol melamine, a resol resin, an epoxy-modified novolak resin, and a urea resin. Moreover, the compounds listed in "Cross-linking Agent Handbook"

(written by Shinzo Yamashita & Tousuke Kaneko, Taiseishya Co., Ltd.) are also preferred. Particularly, phenol derivatives having two or more hydroxymethyl groups or alkoxymethyl groups in the molecule are preferably used in the present invention, as they provide excellent strength of image-bearing portions after images are formed. A specific example of such a phenol derivative is a resol resin.

These cross-linking agents are unstable to heat and exhibit poor stability during storage after being incorporated into image recording materials. In contrast, phenol derivatives having in the molecule two or more hydroxymethyl groups or alkoxymethyl groups and three to five benzene nuclei, and a molecular weight of 1,200 or less are most suitably used in the present invention due to their excellent stability in storage. As to the alkoxymethyl group, those having 6 or less carbon atoms are preferred. Examples thereof include a methoxymethyl group, an ethoxymethyl group, an n-propoxymethyl group, an isopropoxymethyl group, an n-butoxymethyl group, an isobutoxymethyl group, a sec-butoxymethyl group, and a t-butoxymethyl group. An alkoxy-substituted alkoxymethyl group such as a 2-methoxyethoxymethyl group or a 2-methoxy-1-propoxymethyl group is also preferred.

Specifically, compounds listed in JP-A Nos. 6-282067, 7-64285, EP-632003A1, etc. may be used.

In the present invention, the cross-linking agent is added to an image recording material in an amount of 5–70% by weight, preferably 10–65% by weight based on the total weight of the solid components. If the amount of the cross-linking agent is less than 5% by weight, the strength of image-formed portions decreases, whereas if it is more than 70% by weight, the stability during storage is adversely affected.

These cross-linking agents may be used singly or in combination of two or more species.

(B') Carbonyl Compound and Compound Selected from its Equivalents

Aldehydes and ketones may also serve as preferable cross-linking agents in the present invention. Preferably, these compounds have two or more aldehyde or ketone moieties in the molecule. Particularly, an aldehyde compound is preferably used in combination with a polymer of the present invention to generate color in image portions.

In the present invention, examples of the compounds that react with the aforementioned component (A) in the presence of an acid to form dye skeletons include carbonyl compounds (such as aldehydes, ketones, and quinones) and carbonyl equivalents (such as acetals, imines, and amidines), which are collectively referred to as compounds (B').

In the present invention, compounds (B') which may be preferably used are carbonyl compounds (such as aldehydes, ketones, and quinones) and carbonyl equivalents (such as acetals, imines, and amidines). Specifically, the following may be used: aliphatic aldehydes or ketones such as pentanal, malonaldehyde, glyoxal, citral, 1,2,4-butanetricarbaldehyde, acrolein, 1,4-cyclohexanedione, acetylacetone, 7-octene-3,5-dione, and 4-oxo-1-cyclohexanecarboxylic acid; aromatic aldehydes or ketones such as benzaldehyde, terephthalaldehyde, hydroxybenzaldehyde, anisaldehyde, thioanisaldehyde, 1-(2H)-naphthalenone, benzophenone, 2,3,4-trihydroxybenzophenone, 1,2-indanedione, and 1,3,5-triacetylbenzene; heterocyclic aldehydes or ketones such as N-ethylindolecarbaldehyde, N-ethylindoledicarbaldehyde, furfural, furoin, 1-(2-pyridyl)-1-butanone, and 2-pyridone; and quinones such as p-benzoquinone, 1,4-naphthoquinone, anthraquinone, 5,8-dioxo-5,8-dihydroquinoline, 2,5-dichloro-p-benzoquinone, 2,6-dichloro-p-benzoquinone, 2,5-ditoluenesulfonyloxy-p-benzoquinone, 2,3-dichloro-1,4-naphthoquinone, 2,3-phenylthio-1,4-naphthoquinone, and chloranil. These aldehydes, ketones, and quinones may be used as corresponding carbonyl equivalents such as acetals, imines, and amidines derived from these aldehydes, ketones, and quinones.

Of the (B') compounds, preferred are liquids which have a boiling point equal to or higher than 100° C. or compounds which are solid at ordinary temperature. Polymers such as poly(acrolein) and poly(4-formylphenylmethacrylate) are also preferred.

In the present invention, compounds (B') are used in amounts of 2–70% by weight, preferably 5–65% by weight, with respect to the total weight of the solid content of the image-forming material. Amounts less than 2% by weight fail to form color images, whereas amounts in excess of 70% by weight are not preferred from the standpoint of the film strength of the image-bearing portions. These compounds may be used singly or in combinations of two or more species.

In the present invention, it is preferable that compound (A) is a heterocyclic compound or an aromatic hydrocarbon compound which has been substituted by a functional group containing a nitrogen atom and that compound (B') is an aldehyde or a ketone (or a quinone). Ratio in amount of compound (A) to compound (B') may be suitably selected in consideration of the reaction mechanism of the respective compounds. Generally, the ratio (A)/(B') is preferably from 1:9 to 9:1, more preferably from 2:8 to 8:2, on a weight basis.

When the compound (A) (which has a hetero atom in the molecule) and compound (B') (which is selected from the group consisting of carbonyl compounds and their equivalents) are used in combination in the presence of acid, the aforementioned dye skeleton is formed. For example, two molecules of compound (A) having a hetero atom and one molecule of an aldehyde—which is a compound (B')—are reacted in the presence of acid so as to form a leuco dye precursor of triphenylmethane dye, which is subsequently oxidized by oxygen or a suitable oxidizing agent to form a triphenylmethane dye which develops color. Alternatively, when one molecule of compound (A) having a hetero atom and one molecule of a quinone—which is a compound (B')—are reacted in the presence of acid, a merocyanine dye is formed and develops color.

The above-described dye-forming reaction is known in the field of dye synthesis. However, all such known dye-forming reactions are carried out in solution for the purpose of synthesizing a dye. No technique has been reported as to the reaction in coating film as achieved in the present invention. Moreover, it has not been anticipated at all that co-use of an acid generating agent (A) develops color imagewise.

The dye skeleton which is formed through the above reaction can be altered by varying the combination of compounds (A) and (B'). Thus, different color tones can be developed through use of different dye skeletons.

(C) Acid-generating Agent

The acid-generating agent of the present invention denotes a compound which decomposes by light or heat of 100° C. or higher to generate an acid. As to the generated acid, a strong acid having a pKa of 2 or less such as sulfonic acid and hydrochloric acid is preferable. Onium salts such as iodonium salts, sulfonium salts, phosphonium salts, and diazonium salts are preferably used as acid-generating agents in the present invention. Specifically, acid-generating agents described in U.S. Pat. No. 4,708,925 or U.S. Pat. No. 5,372,907 may be used. Particularly, iodonium salts, sulfonium salts, and diazonium salts—all of which contain sulfonate as a counter ion—are preferred. As to the diazonium salts, a diazonium compound described in U.S. Pat. No. 3867147, a diazonium compound described in U.S. Pat. No. 2632703, and diazo resins described in JP-A Nos. 1-102456 and 1-102457 are also preferable. Examples of other preferable acid-generating agents include benzylsulfonates described in U.S. Pat. Nos. 5,135,838 and 5,200,544; active sulfonate esters or disulfonyl compounds described in JP-A Nos. 2-100054 and 2-100055 and Japanese Patent Application No. 8-9444; and haloalkyl-substituted S-triazines described in JP-A No. 7-271029.

These acid-generating agents are added to the image recording material in an amount of 0.01–50% by weight, preferably 0.1–25% by weight, and more preferably 0.5–15% by weight based on the total weight of the solid components. If the amount of the acid-generating agent is less than 0.01% by weight, images cannot be formed, whereas if it is more than 50% by weight, stains generate at the nonimage background portions during printing.

These acid-generating agents may be used singly or in combinations of two or more species.

Spectral Sensitizer

In the present invention, the above-mentioned acid-generating agent decomposes by light or heat to generate acid. A spectral sensitizer is not always required in the case of photo-decomposition, so long as the acid-generating agent is irradiated with a light to be absorbed thereby (e.g, ultraviolet rays). However, a spectral sensitizer is required in the case of irradiation of light which is not absorbed by the acid-generating agent. Conventional spectral sensitizers which have been used in a photo-radical polymerization type image recording material may be used for visible light irradiation. Specifically, Eosines described in JP-A No. 4-219756 and dyes having a thiazolidinone skeleton described in JP-A No. 2-244050 and Japanese Patent Application No. 7-23133 are used. However, in view of the fact that the image recording material of the present invention does not contain radical-polymerizable polyfunctional monomers, it is not clear why the spectral sensitizers effective in the above-mentioned photo-radical polymerization type image recording material are also effective in the present invention.

One of the objects of the present invention is to provide a negative-type image recording material which enables direct plate-making through image recording with an infrared laser beam. In this case, an infrared-absorbing agent must be used in combination as a spectral sensitizer. A dye or a pigment effectively absorbing an infrared beam of the wavelength ranging from 760 nm to 1,200 nm is preferably used as a infrared-absorbing agent in the present invention. Preferably, the dye or the pigment has a maximum absorption peak at a wavelength between 760 nm and 1,200 nm.

Dyes on the market and conventional dyes described in "Senryo Binran" (Dye Handbook) (edited by The Society of Synthetic Organic Chemistry, Japan 1970) may be used. Examples of such dyes include azo dyes, metal complex azo dyes, pyrazolone azo dyes, naphthoquinone dyes, anthraquinone dyes, phthalocyanine dyes, carbonium dyes, quinonimine dyes, methine dyes, cyanine dyes, squarylium dyes, pyrylium salts, and metal thiolato complexes.

Examples of preferable dyes include cyanine dyes described in, for example, JP-A Nos. 58-125246, 59-84356, 59-202829, and 60-78787; methine dyes described in, for example, JP-A Nos. 58-173696, 58-181690, and 58-194595; naphthoquinone dyes described in, for example, JP-A Nos. 58-112793, 58-224793, 59-48187, 59-73996, 60-52940, and 60-63744; squarylium dyes described in, for example, JP-A No. 58-112792; and cyanine dyes described in British Patent No. 434,875.

Near-infrared-absorbing sensitizers described in U.S. Pat. No. 5,156,938 are also preferably used. In addition, the following compounds are also preferred: arylbenzo(thio)pyrylium salts described in U.S. Pat. No. 3,881,924; trimethinethiapyrylium salts described in JP-A No. 57-142645 (U.S. Pat. No. 4,327,169); pyrylium compounds described in JP-A Nos. 58-181051, 58-220143, 59-41363, 59- 84248, 59-84249, 59-146063, and 59-146061; cyanine dyes described in JP-A No. 59-216146; pentamethinethiopyrylium salts described in U.S. Pat. No. 4,283,475; and pyrylium compounds disclosed in Japanese Patent Application Publication (JP-B) Nos. 5-13514 and 5-19702.

Other dyes that are described in U.S. Pat. No. 4,756,993 as formula (I) and (II) compounds of near infrared absorption dyes may also be preferably used.

Of all these dyes, particularly preferred are cyanine dyes, squarylium dyes, pyrylium dyes, and nickel thiolate complexes.

Pigments which may be used in the present invention are commercially available pigments and pigments described in "Color Index (CI) Handbook," "Saishin Ganryo Binran" (Current Pigment Handbook) (edited by Nippon Ganryo Gijutsu Kyokai, 1977), "Saishin Ganryo Ouyou Gijutsu" (Current Pigment Application Technology) (published by CMC Shuppan, 1986), and "Insatsu Inki Gijutsu" (Printing Ink Technology) (published by CMC Shuppan, 1984).

Different types of pigments may be used: black pigments, yellow pigments, orange pigments, brown pigments, red pigments, purple pigments, blue pigments, green pigments, fluorescent pigments, metallic powder pigments, and other pigments such as polymer-linked dyes. Specifically, mention may be made of insoluble azo pigments, azolake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, and carbon black. of these pigments, carbon black is preferred.

These pigments may be used as they are (i.e., without surface treatment) or after surface-treated. Surface treatment methods include surface coating with a resin or wax, depositing a surfactant, and binding a reactive substance (such as silane coupling agents, epoxy compounds, polyisocyanates) to pigment surfaces. These surface treatment methods are described in "Kinzoku-sekken no Seishitsu to Ouyou" (Properties of metallic Soaps and their Applications) (Sachi Shobo), "Insatsu Inki Gijutsu" (Printing Ink Technology) (published by CMC Shuppan, 1984), and "Saishin Ganryo Ouyou Gijutsu" (Current Pigment Application Technology) (published by CMC Shuppan, 1986).

The particle size of the pigments preferably falls within the range of 0.01–10 $\mu$m, more preferably 0.05–1 $\mu$m, and particularly preferably 0.1–1 $\mu$m. Particle sizes of less than 0.01 $\mu$m are not preferred from the point of stability of the dispersion in the image-recording-layer-forming liquid, whereas particle sizes of greater than 10 $\mu$m are not preferred from the point of formation of a uniform image recording layer.

The pigments are dispersed by known techniques used in the manufacture of ink and toners. Apparatuses usable for this purpose include an ultrasonic disperser, a sand mill, an attritor, a pearl mill, a super mill, a ball mill, an impeller, a disperser, a KD mill, a colloid mill, a dynatron, a three-roll mill, and a pressurized kneader. For details, see "Saishin Ganryo Ouyou Gijutsu" (Current Pigment Application Technology) (published by CMC Shuppan, 1986).

These dyes or pigments are incorporated into the image recording material in amounts of 0.01–50% by weight, preferably 0.1–10% by weight, and in the case of dyes, particularly preferably 0.5–10% by weight and in the case of pigments, particularly preferably 1.0–10% by weight, all based on the total solid content of the image recording material. When the amount of the dyes or pigments is less than 0.01% by weight, sensitivity decreases, whereas when it is in excess of 50% by weight, nonimage portions may be stained during printing.

These dyes or pigments and other components may be incorporated in the same layer. Alternatively, the dyes or pigments may be incorporated into a layer different from the layers in which other components are incorporated.

In the case of visible-light sensitizers, the mechanism of exerting their effect is generally attributed to energy transfer and electron transfer (see "Sensitizers" (authored by Katsumi Tokumaru and Makoto Ogawara, published by Kodansha K. K.). However, in the case of infrared sensitizers, the mechanism of sensitization has not yet been clearly elucidated. According to one theory, an infrared absorber generates heat and heat decomposes an acid-generating agent after the infrared absorber absorbs infrared rays.

Other Components

In the present invention, a variety of compounds other than those listed above may be incorporated as desired. For example, dyes exhibiting an extensive absorption in the visible light range may be used as an image-coloring agent. Specific examples include Oil Yellow #101, Oil Yellow #103, Oil Pink #312, Oil Green BG, Oil Blue BOS, Oil Blue #603, Oil Black BY, Oil Black BS, Oil Black T-505 (all of them are manufactured by Orient Chemical Industries Co., Ltd.), Victoria Pure Blue, Crystal Violet (CI42555), Methyl Violet (CI42535), Ethyl Violet, Rhodamine B (CI145170B), Malachite Green (CI42000), and Methylene Blue (CI52015), as well as dyes disclosed in JP-A No. 62-293247.

Because these dyes allow easy discernment between image and nonimage portions after formation of images, incorporation of these dyes is recommended. The amount of the dye(s) is from 0.01 to 10% by weight with respect to the total solid content of the image recording material.

In order to improve the stability during processing over broader ranges of development conditions, the image recording material of the present invention may incorporate nonionic surfactants disclosed in JP-A Nos. 62-251740 and 3-208514 and amphoteric surfactants disclosed in JP-A-59-121044 and 4-13149.0.

Specific examples of nonionic surfactants include sorbitan tristearate, sorbitan monopalmitate, sorbitan trioleate, monoglyceride stearate, and polyoxyethylene nonyl phenyl ether.

Specific examples of amphoteric surfactants include alkyl di(aminoethyl)glycine, alklypolyaminoethylglycine hydrochloride, 2-alkyl-N-carboxyethyl-N-hydroxyethylimidazolinium betaine.

The proportion of the aforementioned nonionic surfactants and amphoteric surfactants to be contained in the image recording material is preferably 0.05–15% by weight, more preferably 0.1–5% by weight.

The image recording material of the present invention may optionally contain a plasticizer so as to impart softness to the coating film. For example, there may be used polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

The image recording material of the present invention may further contain known polymers such as novolak resins and acrylate resins in addition to polymers having heterocyclic groups. Preferably, they are incorporated into the image recording material in amounts equal to or greater than 30% by weight.

The image recording material of the present invention is generally formed by dissolving the above-described respective components in a solvent and applying the resultant solution onto a suitable support. Examples of usable solvents include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methylpyrrolidone, dimethyl sulfoxide, sulfolane, γ-butyrolactone, toluene, and water. These solvents are used singly or in combination. The concentration of the above-described components (the entirety of the solid components including additives) in the solvent is preferably 1–50% by weight. The amount of coating (solid content) obtained on the support after application and drying, which varies in accordance with uses, is generally 0.5–5.0 g/m$^2$ in the case of planographic printing plate material. The smaller the amount, the greater the apparent sensitivity with decreased film characteristics of image-bearing portions. The coating solution may be applied by use of various means generally used for such purposes, for example: bar coaters, rotary means, spray means, curtain application means, dipping means, air knives, blades, rollers, etc.

The image recording material of the present invention may contain a surfactant with an aim to facilitate the coating operation. For example, a fluorine-containing surfactant disclosed in JP-A No. 62-170950 may be incorporated. It is preferably incorporated in an amount of 0.01–1% by weight, more preferably 0.05–0.5% by weight, based on the entirety of the solid content of the image recording material.

Support

The support to which the image recording material of the present invention can be applied is a dimensionally-stable, plate-shaped material. Example of the support include paper, plastic-laminated (e.g., polyethylene, polypropylene, polystyrene, etc.) paper, metal plates (e.g., aluminum, zinc, copper, etc.), plastic films (e.g., cellulose diacetate, cellulose triacetate, cellulose propionate, cellulose lactate, cellulose acetate lactate, cellulose nitrate, polyethylene terephthalate, polyethylene, polystyrene, polypropylene, polycarbonate, polyvinyl acetal, etc.), and paper or plastic films laminated or vapor-deposited with a metal such as one selected from among the above-mentioned metals.

Preferably, a polyester film or an aluminum plate is used. An aluminum plate is particularly preferred due to its excellent dimensional stability and comparatively low price. A pure aluminum plate and an aluminum-base alloy sheet containing traces of hetero-elements are preferably used. A plastic film laminated or vapor-deposited with aluminum may also be used. Examples of hetero-elements include silicon, iron, manganese, copper, magnesium, chromium, zinc, bismuth, nickel, and titanium. The total amount of the hetero-elements is 10% by weight or less. Although pure aluminum is particularly suitable in the present invention, aluminum may contain traces of hetero-elements in view of the fact that refining pure aluminum is difficult. Thus, the composition of the aluminum plate which may be used in the present invention is not particularly limited, and conventionally known aluminum plates may be suitably selected. The thickness of the aluminum plate used in the present invention is approximately 0.1–0.6 mm, preferably 0.15–0.4 mm, and particularly preferably 0.2–0.3 mm.

Before roughening the aluminum plate, a degreasing step may be performed to remove the rolling oil from the plate surface. The degreasing step is performed by use of a surfactant, an organic solvent, or an aqueous alkali solution.

The surface of an aluminum plate may be roughened by use of a variety of methods: mechanical roughening, electrochemical dissolving, and chemical dissolving of selected portions. Mechanical methods which may be used include a ball-graining method, brush-graining method, blast-graining method, buffing, and other known methods. Electrochemical roughening may be performed by passing an AC or DC current in an electrolysis solution containing HCl or $HNO_3$ electrolyte. Alternatively, mechanical and electrochemical methods may be used in combination as disclosed in JP-A No. 54-63902.

The thus-roughened aluminum plate is subjected to alkali etching and neutralizing if necessary, and subsequently to anodizing so as to enhance water-retainability and abrasion resistance of the surface as desired. As regards electrolytes which may be used for anodizing, a number of electrolytes that form porous oxide film may be used. In general, sulfuric acid, phosphoric acid, oxalic acid, chromic acid, and mixtures thereof may be used. The concentration of the electrolyte is suitably determined in accordance with the identity of the electrolyte.

The processing conditions for anodizing the plate vary in accordance with the electrolyte employed, and thus cannot be specified unconditionally. However, the conditions are generally such that the concentration of the electrolytes is 1–80% by weight, liquid temperature is 5–70° C., current density is 5–60 A/dm$^2$, voltage is 1–100 V, and duration of electrolysis is from 10 seconds to 5 minutes.

When the amount of anodized coating film is less than 1.0 g/m$^2$, press life is unsatisfactory, or nonimage portions of the planographic printing plate become scratched or damaged more easily. In the latter case, the so-called "scratch toning" is caused in which ink is deposited on scratched portions during printing.

If necessary, the surface of the aluminum plate may be subjected to additional treatment to improve hydrophilicity after being anodized. Examples of such treatments which may be usable in the present invention include methods making use of an alkali metal silicate (e.g., sodium silicate) described in U.S. Pat. Nos. 2,714,066, 3,181,461, 3,280,734, and 3,902,734. According to this method, a support is soaked in an aqueous sodium silicate solution or subjected to eletrolytic processing. Other usable methods include treatment with potassium fluoro zirconate disclosed in JP-B No. 36-22063 and treatment with polyvinylphosphonic acid disclosed in U.S. Pat. Nos. 3,276,868, 4,153,461, and 4,689,272.

Others

Prior to the application of the image recording material of the present invention to a support, the support may be provided with an undercoat layer if necessary.

A variety of organic compounds may be used as a component of the undercoat layer. Examples include carboxymethyl cellulose; dextrin; acacia; phosphonic acids having an amino group such as a 2-aminoethylphosphonic acid moiety; organic phosphonic acids such as (substituted) phenylphosphonic acid, (substituted) naphthylphosphonic acid, (substituted) alkylphosphonic acid, (substituted) glycerophosphonic acid, (substituted) methylenediphosphonic acid, and (substituted) ethylenediphosphonic acid; organic phosphoric acids such as (substituted) phenylphosphoric acid, (substituted) naphthylphosphoric acid, (substituted) alkylphosphoric acid, and (substituted) glycerophosphoric acid; organic phosphinic acids such as (substituted) phenylphosphinic acid, (substituted) naphthylphosphinic acid, (substituted) alkylphosphinic acid, and (substituted) glycerophosphinic acid; amino acids such as glycine and β-alanine; and amine hydrochlorides having a hydroxyl group such as triethanolamine hydrochloride. These compounds may be used in combinations of two or more. In addition, above mentioned diazonium compounds are also preferable. A suitable coating amount of the undercoat layer is 2–200 mg/m$^2$.

Through the above-described materials and processes, a planographic printing plate material incorporating the image recording material of the present invention can be prepared. The planographic printing plate material is preferably imagewise-exposed by use of a solid-state or semiconductor laser device which emits infrared rays having a wavelength of 760 nm to 1,200 nm. The planographic printing plate material incorporating the image recording material of the present invention may be developed immediately after irradiation of laser beams. Alternatively, thermal treatment may be performed between the laser irradiation step and the developing step. When a thermal treatment is performed, the temperature is within the range of 60° C. to 150° C., and the length of time is between five seconds to five minutes. Various conventionally known heating means may be used: heating with a panel heater or a ceramic heater, and a method employing a lamp. Specifically, mention may be made of the method described in Japanese Patent Application No. 8-94197. Thermal treatment is effective in decreasing the laser energy required for recording during laser irradiation.

When thermal treatment is performed imagewise in the manufacture of the planographic printing plate material of the present invention by the heat, the acid-generating agent generates acid, which acid initiates a cross-linking reaction. The cross-linking reaction is then accelerated by heat. In contrast, when light is irradiated imagewise, the acid-generating agent generates acid upon exposure to light, which acid initiates a cross-linking reaction. The cross-linking reaction is accelerated by the application of heat. Heating in this latter case, despite being mild, exhibits a more considerable effect of acceleration than the former sole thermal treatment. In this processing stage therefore, irradiation of light with thermal treatment are preferably performed in combination, or only thermal treatment may be performed.

After the thermal processing has been performed, the image recording material of the present invention is developed according to demands with, preferably, water or an aqueous alkali solution.

When an aqueous alkaline solution is used, any conventionally known aqueous alkaline solution may be used as the developer or replenisher for use with the image recording material of the present invention. For example, there may be used inorganic alkali salts such as sodium silicate and potassium silicate; sodium tertiary phosphate, potassium tertiary phosphate, and ammonium tertiary phosphate; sodium secondary phosphate, potassium secondary phosphate, and ammonium secondary phosphate; sodium carbonate, potassium carbonate, and ammonium carbonate;

sodium hydrogencarbonate, potassium hydrogencarbonate, and ammonium hydrogencarbonate; sodium borate, potassium borate, and ammonium borate; and sodium hydroxide, ammonium hydroxide, potassium hydroxide, and lithium hydroxide. In addition, there may also be used organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

These alkali agents may be used singly or in combinations of two or more.

Of the above-listed alkali agents, particularly preferred are aqueous solutions of a silicate such as sodium silicate or potassium silicate. This is because developability can be varied by altering the ratio of a silicon oxide ($SiO_2$), which is a component of a silicate, to an alkali metal oxide ($M_2O$) or the concentrations of these components. For example, alkali metal silicates described in JP-A No. 54-62004 and JP-B No. 57-7427 are advantageously used.

When automatic developing apparatus is used for carrying out development, it is known that an increased number of plate materials for planography can be processed without changing the developing solution in the developer tank for a long period, if an aqueous solution (replenisher) having a higher alkalinity than the developing solution is added to the developing solution. In the present invention, this approach of employing a replenisher is advantageously used.

The developing solution and the replenisher may contain a variety of surfactants and organic solvents for different purposes: acceleration or inhibition of developability, dispersion of development scum, and improvement in ink compatibility of the image portions of the printing plate. Preferable surfactants may be anionic, cationic, nonionic, or amphoteric. Preferable organic solvents are led by benzyl alcohol, etc. In addition, polyethylene glycol or its derivatives, as well as polypropylene glycol or its derivatives may be advantageously used.

The developing solution and the replenisher may also contain inorganic reducing agents such as hydroquinone, resorcine, sodium sulfites, sodium hydrogen sulfite, potassium sulfite, or potassium hydrogen sulfite; organic carboxylic acid; antifoaming agent; and water softeners.

Examples of developing solutions that contain the aforementioned surfactants, organic solvents, reducing agents, etc. include developer compositions described in JP-A No. 51-77401 and containing benzyl alcohol, an anionic surfactant, an alkali agent, and water; developer compositions described in JP-A No. 53-44202 and comprising an aqueous solution containing benzyl alcohol, an anionic surfactant, and a water-soluble sulfite; and developer compositions described in JP-A No. 55-155355 and containing an organic solvent having a solubility in water of not more than 10% by weight at ordinary temperature, an alkali agent, and water. These compositions may also be suitably used in the present invention.

Printing plates which have been processed for developing by use of the above-described development solutions and replenishers are post-treated with washing water, a rinse solution containing a surfactant, etc., or with a desensitizing liquid containing acacia and starch derivatives. When the image-recording material of the present invention is used as a plate material for printing, post-treatment may include these steps in suitable combinations.

In recent years, automatic developing apparatuses for processing plate materials for printing have come to be used widely in the plate-making and printing industry, so as to rationalize and standardize the plate-making work. An automatic developing apparatus, which generally has a developing section and a post-treatment section, includes a conveyor device for transporting a printing plate material, processing tanks, and spray devices. In use of the apparatus, a printing plate that has been exposed to light is transported horizontally, during which respective processing solutions supplied by pumps are sprayed through spray nozzles to carry out development. According to another method which has come to be known recently, a printing plate material is soaked in processing tanks filled with processing solutions and conveyed by under-water guide rolls or similar means. Automated processing thus enables processing of printing plate materials while a replenisher being added to each processing solution in accordance with the amount of processing or operation time.

In addition, the so-called disposable processing—in which materials are always processed with substantially fresh processing solutions—may also be used.

The thus-obtained planographic printing plate is coated with a desensitizing gum if necessary, and subsequently forwarded to the printing step. When even longer press life is desired, the planographic printing plate is subjected to a burning treatment.

When a planographic printing plate undergoes burning, the plate is preferably treated with a counter-etching solution described, for example, in JP-B Nos. 61-2518 and 55-28062, JP-A No. 62-31859, and JP-A No. 61-159655, before burning.

Counter-etching may be performed by applying a counter-etching solution onto a planographic printing plate by use of sponge or absorbent cotton that has absorbed the counter-etching solution, by soaking the plate in a counter-etching solution filled in a tray, or by use of an automated coater. When the amount of coating is made even with a squeegee or a squeegee roller after application of the counter-etching solution, a more preferable effect is obtainable.

A suitable amount of coating of the counter-etching solution is generally from 0.03 to 0.8 $g/m^2$ (dry weight).

A planographic printing plate material that has been coated with a counter-etching solution is dried if necessary, then heated to a high temperature through a burning processor (e.g., BP-1300; a burning processor sold by Fuji Photo Film Co., Ltd.). Although the heating temperature and duration may depend on the identity of the components that form images, preferred ranges for temperature and duration are 180–300° C. for 10–20 minutes.

If necessary, a planographic printing plate material that has been subjected to a burning treatment may undergo additional processing which has been performed conventionally (such as washing with water and application of gum). When the counter-etching solution contained a water-soluble polymer compound is used, so-called desensitizing treatment such as application of gum may be omitted.

The planographic printing plate material obtained through the above-described process are set in an offset printing press for producing a great number of prints.

Thus, the present invention provides negative-type image recording materials exhibiting excellent resistance to plate wear and stain during printing.

In addition, since the present invention enables recording of images through use of a solid-state laser or a semiconductor laser that emit especially infrared rays, computer digital data can be directly plate-making, and in this case also, there can be obtained negative-type image recording materials exhibiting excellent resistance to plate wear and stain during printing.

The color-developing image forming material of the present invention has advantages: it allows for recording color-developed images upon exposure to light or heat without use of leuco dyes, and the developed-image-bearing portions have excellent film strength.

EXAMPLES

The present invention will next be described in detail by way of examples, which should not be construed as limiting the invention. Throughout this section, a "polymer having a heterocyclic group containing an unsaturated bond therein (A)" is hereinafter simply referred to as a "Polymer."

Preparation of Polymer [BP-1]

An oil dispersion (7.2 g) of sodium hydride (0.21 mol) and tetrahydrofuran (50 ml) were placed in a 500-ml flask equipped with a stirrer and a condenser tube, and the mixture was stirred in an ice-water bath. Indole (24.60 g, 0.21 mol) dissolved in tetrahydrofuran (100 ml) was gradually added dropwise to the mixture. After completion of addition, the ice-water bath was removed, and the mixture was stirred for one hour at room temperature. Subsequently, 2-chloroethyl p-toluenesulfonate (49.29 g, 0.21 mol) was added, and the mixture was allowed to react for 15 hours while being stirred under heat-reflux conditions. After completion of reaction, insoluble matter was removed by filtration, and the filtrate was concentrated under reduced pressure. The reaction mixture was purified by silica gel column chromatography to obtain 1-(2-chloroethyl)indole (15.4 g).

Subsequently, 1-(2-chloroethyl)indole (15.4 g), potassium methacrylate (21.3 g), potassium iodide (7.1 g), N,N-dimethylformamide (40 ml), and a small amount of hydroquinone were placed in a 200-ml flask equipped with a stirrer and a condenser tube. The mixture was heated to 100° C. and stirred for 2.5 hours. After completion of reaction, insoluble matter was removed by filtration, and the filtrate was concentrated under reduced pressure. This reaction mixture was purified further by silica gel column chromatography to obtain 1-(2-methacryloyloxyethyl) indole (15.5 g).

Subsequently, 1-methoxy-2-propanol (14.75 g) was placed in a 100-ml flask equipped with a stirrer and a condenser tube and heated to 75° C. under nitrogen. While the content of the flask was being stirred, a mixture of 1-(2-methacryloyloxyethyl)indole (11.28 g), methacrylic acid (1.36 g), V-601 (0.0748 g; an azo-type polymerization initiator, Wako Pure Chemical Industries Ltd.), and 1-methoxy-2-propanol (14.75 g) was added dropwise over 2.5 hours. After completion of addition, V-601 (0.0748 g) was added again and the mixture was stirred at 75° C. for 3 hours. After completion of reaction, the reaction mixture was cooled to room temperature. Methanol (50 ml) was added, and the mixture was poured into stirred water (1 liter). Precipitates were collected by filtration and dried under reduced pressure to obtain Polymer [BP-1] (12.6 g). The weight average molecular weight measured by GPC was $5.4 \times 10^4$ (polystyrene standard).

Preparation of Polymer [BP-2]

A mixture containing 3-(2-hydroxyethyl)indole (24.18 g; 0.15 mol), triethylamine (16.19 g; 0.16 mol), 4-(N,N-dimethylamino)pyridine (2.44 g; 0.02 mol), ethyl acetate (200 ml), and a small amount of hydroquinone was placed in a 500-ml flask equipped with a stirrer and a condenser tube and the mixture was stirred in an ice-water bath. To this mixture, methacrylic anhydride (27.75 g; 0.18 mol) was gradually added dropwise. After completion of addition, the ice-water bath was removed and the mixture was stirred at room temperature for 3 hours. After completion of reaction, insoluble matter was removed by filtration, and the filtrate was concentrated under reduced pressure. The reaction mixture was purified by silica gel column chromatography to obtain 3-(2-methacryloyloxyethyl)indole (25.0 g).

Next, 1-methoxy-2-propanol (14.75 g) was placed in a 100-ml flask equipped with a stirrer and a condenser tube and the content was heated to 75° C. under nitrogen. While the contents of the flask were stirred, the mixture of 3-(2-methacryloyloxyethyl)indole (11.28 g), methacrylic acid (1.36 g), V-601 (0.0748 g; an azo-type polymerization initiator, Wako Pure Chemical Industries Ltd.), and 1-methoxy-2-propanol (14.75 g) was added dropwise over 2.5 hours. After completion of addition, V-601 (0.0748 g) was added again and the mixture was stirred at 75° C. for 3 hours. After completion of reaction, the reaction mixture was cooled to room temperature. Methanol (50 ml) was added, and the mixture was poured into water (1 liter) while being stirred. Precipitates were collected by filtration and dried under reduced pressure to obtain Polymer [BP-2] (12.4 g). The weight average molecular weight measured by GPC was $7.2 \times 10^4$ (polystyrene standard)

Preparation of Polymer [BP-3]

2-(5-Aminopentyl)benzothiazole (synthesized from 2-aminobenzenethiol and ε-caprolactam) was reacted with a mixed acid anhydride of methacrylic acid and carbonic acid prepared through reaction of methacrylic acid and ethyl chloroformate under basic conditions to obtain 2-(5-methacryloylaminopentyl)benzothiazole. Copolymerization with acrylic acid afforded a Polymer [BP-3] which is used in the present invention. The weight average molecular weight measured by GPC was $11.0 \times 10^4$ (polystyrene standard)

Preparation of Polymer [BP-4]

2-(5-Hydroxypentyl)benzoxazole (synthesized from 2-aminophenol and ε-caprolactam) was reacted with acrylic acid chloride under basic conditions to obtain 2-(5-acryloyloxypentyl)benzothiazole. Copolymerization with acrylic acid afforded a Polymer [BP-4], which is used in the present invention. The weight average molecular weight measured by GPC was $12.8 \times 10^4$ (polystyrene standard).

Preparation of Polymer [BP-5]

2-(5-Aminopentyl)benzimidazole (synthesized from m-phenylenediamine and ε-caprolactam) was reacted with methacrylic anhydride to obtain 2-(5-methacryloylaminopentyl)benzimidazole. Copolymerization with butyl acrylate and acrylic acid afforded a Polymer [BP-5], which is used in the present invention. The weight average molecular weight measured by GPC was $10.3 \times 10^4$ (polystyrene standard).

Preparation of Polymer [BP-6]

p-(Imidazolylmethyl)styrene was synthesized from p-chloromethylstyrene and imidazole, and copolymerized with methacrylic acid and 1-(2-methacryloyloxyethyl) indole used in the synthesis of Polymer [BP-1] to thereby obtain a Polymer [BP-6], which is used in the present invention. The weight average molecular weight measured by GPC was $7.8 \times 10^4$ (polystyrene standard).

Preparation of Polymer [BP-7]

2-(2-Carboxyethylthio)benzthiazole synthesized from 2-mercaptobenzthiazole and acrylic acid was reacted with thionyl chloride to obtain the corresponding acid chloride, which was reacted further with N-(p-sulfamoylphenyl) methacrylamide to obtain 2-(2-(p-methacryloylaminophenyl)sulfonylaminocarbonylethylthio) Benzathiazole. Copolymerization with ethyl methacrylate afforded a Polymer [BP-7] which is used in the present invention. The weight average molecular weight measured by GPC was $8.3 \times 10^4$ (polystyrene standard).

Preparation of Polymer [BP-8]

2-(Methacryloylamino)benzthiazole synthesized from 2-aminobenzthiazole and methacrylic anhydride was copolymerized with benzyl methacrylate and p-styrenecarboxylic acid to thereby obtain a Polymer [BP-8], which is used in the present invention. The weight average molecular weight measured by GPC was $9.6 \times 10^4$ (polystyrene standard).

Preparation of Polymer [BP-9]

2-(Acryloylamino)benzothiazole synthesized from 2-aminobenzothiazole and acrylic acid chloride under basic conditions was copolymerized with ethyl acrylate to thereby obtain Polymer [BP-9], which is used in the present invention. The weight average molecular weight measured by GPC was $10.6 \times 10^4$ (polystyrene standard).

TABLE 1

| Polymer used in the present invention (copolymer) | Structural unit of copolymer (molar ratio of the units, weight av. M.W.) |
|---|---|
| [BP-1] | 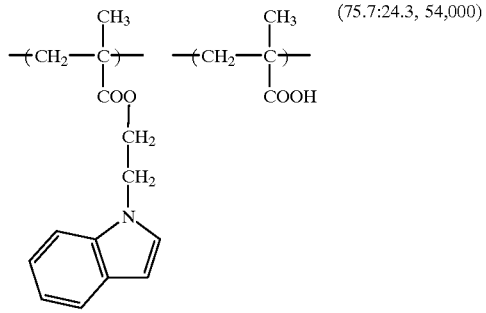 (75.7:24.3, 54,000) |
| [BP-2] | (75.4:24.3, 72,000) |
| [BP-3] | (71.0:29.0, 110,000) |

TABLE 2

| Polymer used in the present invention (Copolymer) | Structural unit of copolymer (molar ratio of the units, weight av. M.W.) |
|---|---|
| [BP-4] | 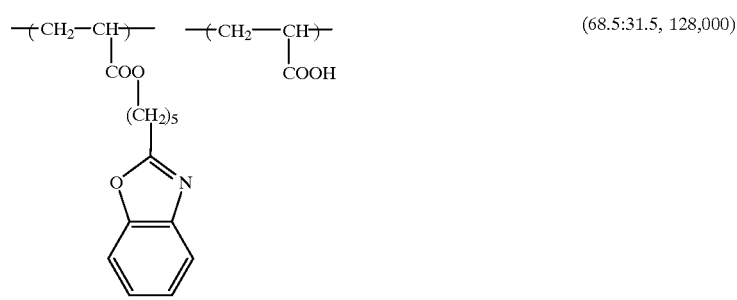 (68.5:31.5, 128,000) |

TABLE 2-continued
| Polymer used in the present invention (Copolymer) | Structural unit of copolymer (molar ratio of the units, weight av. M.W.) |
|---|---|
| [BP-5] 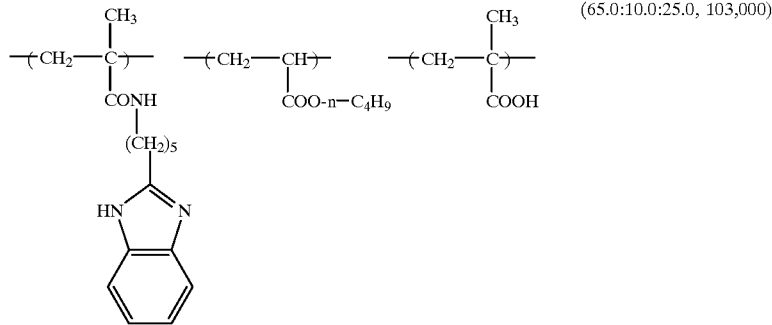 | (65.0:10.0:25.0, 103,000) |
| [BP-6] 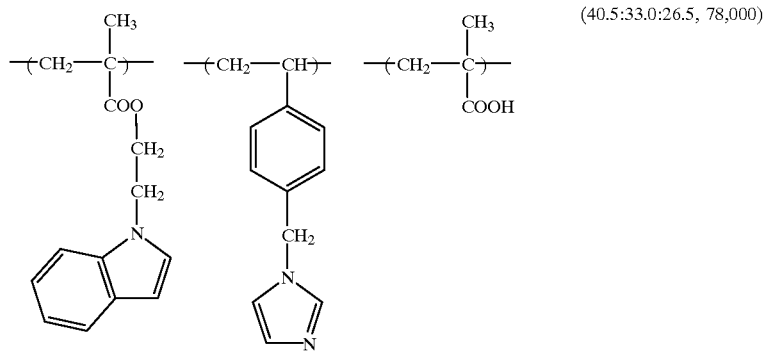 | (40.5:33.0:26.5, 78,000) |

TABLE 3

| Polymer used in the present invention (Copolymer) | Structural unit of copolymer (molar ratio of the units, weight av. M.W.) |
|---|---|
| [BP-7] 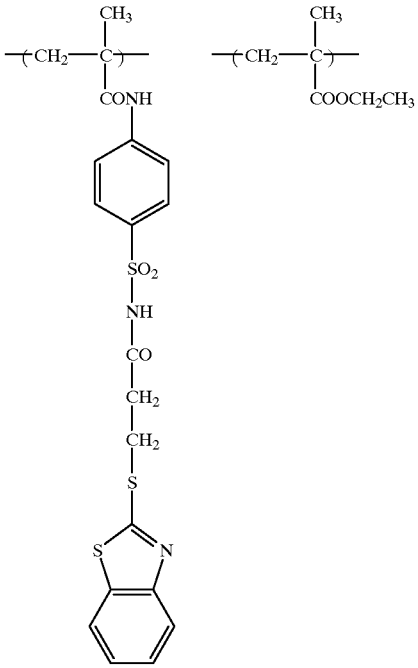 | (95.0:5.0, 83,000) |
| [BP-8] 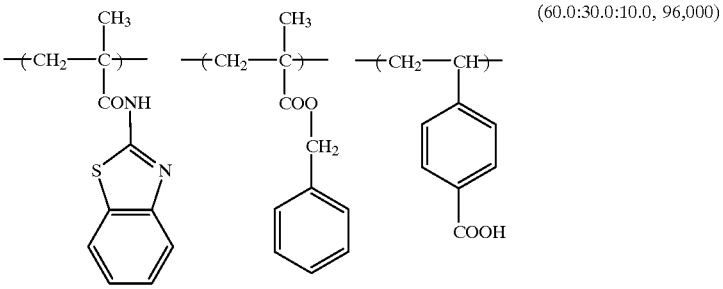 | (60.0:30.0:10.0, 96,000) |
| [BP-9] 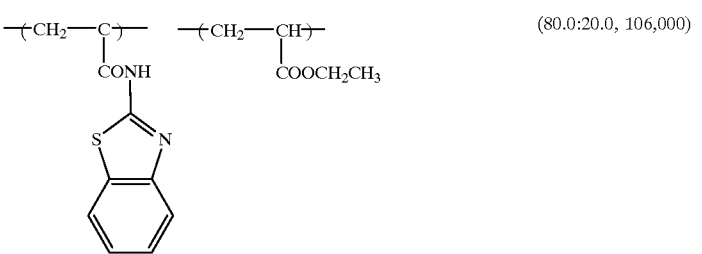 | (80.0:20.0, 106,000) |

Example 1

An aluminum plate (thickness: 0.30 mm, material quality: 1050) was washed for degreasing with trichloroethylene. Thereafter, the surface of the plate was grained by use of a nylon brush and a pumice stone powder (400 mesh)-water suspension, then washed with water sufficiently. After the plate was soaked in 25% aqueous sodium hydroxide solution (45° C.) for 9 seconds for etching and washed with water, the plate was soaked further in 2% aqueous $HNO_3$ for 20 seconds and washed with water. In this case, the amount of etching on the grained surface was about 3 g/m². Subsequently, the plate was coated with an oxidized film (3 g/m²) on a DC anode with a current density of 15 A/dm² in an electrolysis solution containing 7% $H_2SO_4$ electrolyte.

After being soaked in a 2.5% sodium silicate solution at 70° C. for one minute, the plate was washed with water and dried. Thereafter, the aluminum plate was coated with an undercoating liquid having the following composition and dried at 80° C. for 30 seconds. The amount of coating after drying was 20 mg/m².

| Composition of undercoating liquid | |
|---|---|
| Dibutylnaphthalenesulfonate of a condensate of 4-diazodiphenylamine and phenoxyacetic acid with formaldehyde | 0.1 g |
| Methanol | 100 g |

Subsequently, a Solution [p] having the following composition was prepared and applied to the aluminum plate that had been undercoated as described above. The plate was dried for one minute at 100° C. to thereby obtain a negative-type planographic printing plate material [P-1]. The amount of the coating film after drying was 1.5 g/m². The surface color of the plate was green.

| Composition of Solution [p] | |
|---|---|
| Polymer [BP-1] | 1.6 g |
| Thermal cross-linking agent [N-1] | 0.4 g |
| Acid-generating agent [S-1] | 0.15 g |
| Infrared absorbing agent [K-1] | 0.10 g |
| Megafak F-177 (a fluorine-type surfactant, Dainippon Ink and Chemicals, Inc.) | 0.06 g |
| Methyl ethyl ketone | 15 g |
| 1-Methoxy-2-propanol | 5 g |
| Methyl alcohol | 7 g |

The structures of thermal cross-linking agent [N-1], acid-generating agent [S-1], and infrared absorbing agent [K-1] contained in the above-described composition are shown below.

Thermal cross-linking agent [N-1]

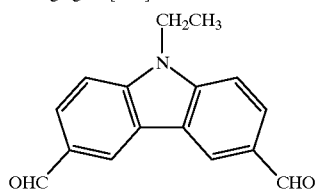

Acid-generating agent [S-1]

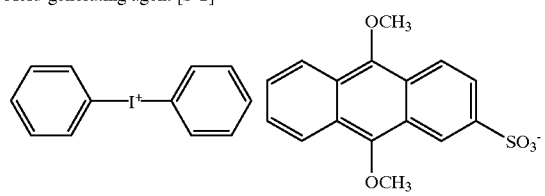

Infared absorbing agent [K-1]

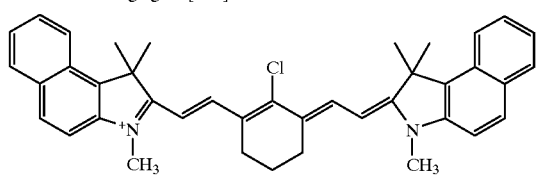

-continued

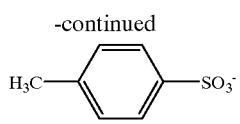

The thus-obtained negative-type planographic printing plate material [P-1] was exposed to ultraviolet rays (wavelength: 350–400 nm) After exposure, the material was thermally treated for 15 seconds at 90° C. with a panel heater, developed with a developer DN-3C (diluted with water at a ratio of 1:2, Fuji Photo Film Co., Ltd.), and washed with water. The image portion of the thus-obtained planographic printing plate developed a red-purple color. This planographic printing plate was used for printing with a printer (Heidel KOR-D). When the resultant prints were checked, the first 55,000 sheets were found to be satisfactory, and no stain was found in nonimage portions.

Example 2

The negative-type planographic printing plate material [P-1] obtained in Example 1 was exposed to infrared rays (wavelength: 830–850 nm) from a semiconductor laser. After exposure, the material was thermally treated for 15 seconds at 90° C. with a panel heater, developed with a developer DN-3C (diluted with water at a ratio of 1:2, Fuji Photo Film Co., Ltd.), and washed with water. As in the case of Example 1, the image portion of the thus-obtained planographic printing plate developed a red-purple color. This planographic printing plate was used for printing with a printer (Heidel KOR-D). When the resultant prints were checked, the first 51,000 sheets had no stain in the nonimage portions, and thus were found to be satisfactory.

Examples 3–8

Six types of Solutions [p-2] to [p-7], which corresponded to Solution [p] in Example 1, were prepared by changing the polymer as shown in Table 4. The undercoated aluminum plates used in Example 1 were coated with these solutions and dried for one minute at 100° C. to obtain negative-type planographic printing plate materials [P-2] to [P-7]. The amount of the coating film was 1.5 g/m².

The thus-obtained negative-type planographic printing plate materials [P-2] to [P-7] were exposed to infrared rays (wavelength: 830–850 nm) from a semiconductor laser device. After exposure, the materials were thermally treated for 15 seconds at 90° C. with a panel heater, developed with a developer DN-3C (diluted with water at a ratio of 1:2, Fuji Photo Film Co., Ltd.), and washed with water. These planographic printing plates were used for printing with a printer (Heidel KOR-D), and the resultant prints were checked. The results are shown in Table 4. The first 50,000 or more sheets were found to be satisfactory in all cases and no prints had stained nonimage portions.

TABLE 4

| Example No. | Planographic printing plate material | Polymer | Sheets of good printing unit: thousand |
|---|---|---|---|
| Example 3 | [P-2] | [BP-2] | 53 |
| Example 4 | [P-3] | [BP-3] | 56 |
| Example 5 | [P-4] | [BP-4] | 52 |
| Example 6 | [P-5] | [BP-5] | 54 |

TABLE 4-continued

| Example No. | Planographic printing plate material | Polymer | Sheets of good printing unit: thousand |
|---|---|---|---|
| Example 7 | [P-6] | [BP-6] | 50 |
| Example 8 | [P-7] | [BP-1] (0.8 g) & [BP-3] (0.8 g) | 52 |

Comparative Example 1

A Solution [q-1] was prepared by use of a copolymer (molar ratio: 70:30, weight av. MW: 7.2×10$^4$) of benzyl methacrylate and methacrylic acid instead of Polymer [BP-1] in Solution [p] used in Example 1. This solution was applied to the undercoated aluminum plate used in Example 1 and dried for one minute at 100° C. to obtain a negative-type planographic printing plate material [Q-1]. The amount of the coating film after drying was 1.5 g/m$^2$. In the same manner as in Example 2, the thus-obtained negative-type planographic printing plate material [Q-1] was subjected to formation of images and printing. When the resultant prints were checked, those found to be satisfactory were only the first 25,000 sheets. No stain was found in nonimage portions.

As shown in Examples 2 to 8 and Comparative Example 1, the planographic printing plate material using the negative-type image-recording material of the present invention was found to provide excellent press life.

Examples 9–11

An aluminum plate (thickness: 0.30 mm, material quality: 1050) was washed for degreasing with trichloroethylene. Thereafter, the surface of the plate was grained by use of a nylon brush and a purmice stone powder (400 mesh)-water suspension, then washed with water sufficiently. After, this plate was soaked in a 25% aqueous sodium hydroxide solution (45° C.) for 9 seconds for etching and washed with water, the plate was soaked further in 2% aqueous HNO$_3$ for 20 seconds and washed with water. In this case, the amount of etching on the grained surface was about 3 g/m$^2$. Subsequently, the plate was coated with an oxidized film (3 g/m$^2$) on a DC anode with a current density of 15 A/dM$^2$ in an electrolysis solution containing 7% H$_2$SO$_4$ electrolyte, washed with water, and dried. Thereafter, the aluminum plate was coated with an undercoating liquid having the following composition and dried at 80° C. for 30 seconds. The amount of coating after drying was 10 mg/m$^2$.

| Composition of undercoating liquid | |
|---|---|
| β-Alanine | 0.1 g |
| Phenylphosphonic acid | 0.05 g |
| Methanol | 40 g |
| Pure water | 60 g |

Three types of Solutions [r-1] to [r-3] were prepared by changing the polymer and thermal cross-linking agent used in the composition of Solution [r] as indicated in Table 5. The aforementioned aluminum plates were coated with the resultant solutions and dried for one minute at 100° C. to obtain negative-type planographic printing plate materials [R-1] to [R-3]. The amount of the coating film after drying was 1.6 g/m$^2$.

| Composition of Solution [r] | |
|---|---|
| Polymer | 1.6 g |
| Thermal cross-linking agent | 0.4 g |
| Acid-generating agent [S-1] | 0.15 g |
| Infrared absorbing agent (trade name: NK-3508, Nippon Kankou Shikiso Kenkyusho K.K.) | 0.15 g |
| Dye corresponding to Victoria Pure Blue BOH in which the counter ion is replaced by 1-naphthalene-sulfonic acid | 0.05 g |
| Megafak F-177 (a fluorine-type surfactant, Dainippon Ink And Chemicals, Inc.) | 0.06 g |
| Methyl ethyl ketone | 15 g |
| 1-Methoxy-2-propanol | 5 g |
| Methyl alcohol | 7 g |

The thus-obtained negative-type planographic printing plate materials [R-1] to [R-3] were exposed to a YAG laser from a solid state laser device which emits infrared rays having a wavelength of about 1,064 nm. After exposure, the materials were thermally treated for 15 seconds at 100° C. in an oven and processed through an automatic developing apparatus charged with a developer DP-4 (1:8, Fuji Photo Film Co., Ltd.) and a rinsing liquid FR-3 (1:7). Subsequently, the plate surface was treated with a gum GU-7 (1:1, Fuji Photo Film Co., Ltd.) and used for printing with a printer(Heidel KOR-D). The results are shown in Table 5. In all cases, the first 50,000 or more sheets of prints were found to be satisfactory and all prints were free of stained nonimage portions.

TABLE 5

| Example No. | Planographic printing plate material | Polymer | Cross-linking agent | Sheets of good printing unit: thousand |
|---|---|---|---|---|
| Example 9 | [R-1] | [BP-7] | [N-2] | 52 |
| Example 10 | [R-2] | [BP-7] | [N-2] (0.2 g) & [N-3] (0.2 g) | 55 |
| Example 11 | [R-3] | [BP-8] | [N-4] | 53 |

Thermal cross-linking agent [N-2]

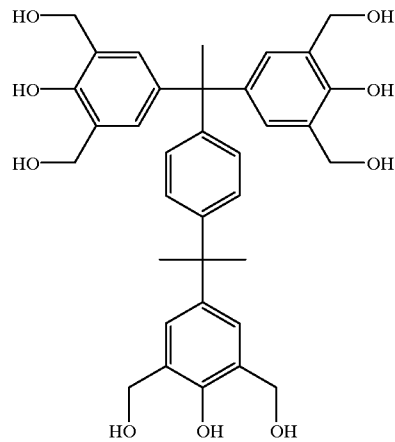

-continued

Thermal cross-linking agent [N-3]

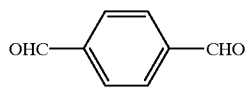

Thermal cross-linking agent [N-4]

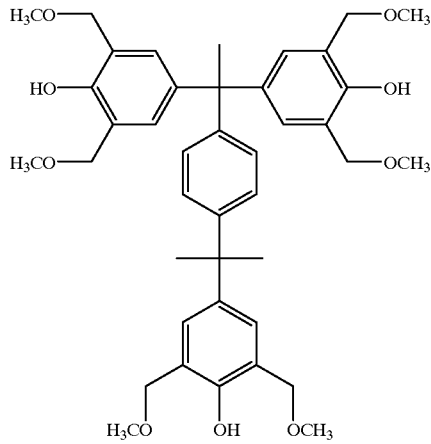

Comparative Example 2

In a manner similar to that in Example 9, a negative-type planographic printing plate material [S-1] was prepared except that a novolak resin (weight average MW: 2,500) prepared from reaction of m-cresol and formaldehyde under acidic conditions was used instead of Polymer [BP-7] used in Solution [r-1]. The thus-obtained planographic printing plate material [S-1] was subjected to formation of images and printing in the same way as in Example 9. When the resultant prints were checked, those found to be satisfactory comprised only the first 21,000 sheets and slight stain was found in nonimage portions.

As described in Examples 9 to 11 and Comparative Example 2, the planographic printing plate materials incorporating the negative-type image-recording material of the present invention provided excellent press life, and excellent stain-resistance in nonimage portions.

Example 12

Use as a Proof A solution [v] having the following composition was prepared, applied to a surface-treated PET film, and dried for one minute at 100° C. to obtain a color image-forming material [V-1]. The amount of the coating film after drying was 1.5 g/m². The color of the film was slightly yellowish but almost colorless.

| Solution [v] | |
|---|---|
| Acid-generating agent [S-1] | 0.15 g |
| Polymer [BP-1] | 1.6 g |
| Thermal cross-linking agent [N-1] | 0.4 g |
| Fluorine-type surfactant (Megafak F-177, Dainippon Ink and Chemicals, Inc.) | 0.06 g |
| Methyl ethyl ketone | 15 g |
| 1-Methoxy-2-propanol | 5 g |
| Methyl alcohol | 7 g |

Among the components of the aforementioned Solution [v], Component (C) of the present invention corresponds to acid-generating agent [S-1], and among compounds causing a reaction to form a dye skeleton in the presence of an acid, Polymer [BP-1] represents Component (A). Thermal cross-linking agent [N-1] represents Component (B). The structures of Acid-generating agent [S-1] and Thermal cross-linking agent [N-1] used in the example are shown below.

When the thus-obtained image forming material [V-1] was exposed to ultraviolet rays, the exposed portion developed a purple color. Further, when this material was thermally treated for 15 seconds at 90° C. with a panel heater, the color density increased. The color-generated image was printed onto paper by use of a heat roller. There was no change in color of image portions.

Example 13

Use as a Proof

Image forming material [V-1] obtained in Example 1 was exposed to light and heated in the same way as in Example 1. Subsequently, when the material was soaked in an alkaline solution having the following composition, the unexposed portion was dissolved and removed. In this case, the color of image portions retained purple color. When the color-generated image was printed onto paper by use of a heat roller, there was no change in color of image portions.

| <Alkaline solution> | |
|---|---|
| sodium hydrogencarbonate | 10 g |
| sodium carbonate | 20 g |
| sodium butylnaphthalene sulfonate | 50 g |
| water | 920 g |

Example 14

Use as Heat-sensitive Paper

A solution [w] having the following composition was prepared, applied to paper, and dried for one minute at 100° C. to obtain a color image-forming material [w-1]. The amount of the coating film after drying was 1.6 g/m². The surface color of the film was almost colorless.

| Solution [w] | |
|---|---|
| Acid-generating agent [S-2] | 0.15 g |
| Polymer [BP-1] | 1.6 g |
| Thermal cross-linking agent [N-3] | 0.4 g |
| Fluorine-type surfactant (Megafak F-177, Dainippon Ink and Chemicals, Inc.) | 0.06 g |
| Methyl ethyl ketone | 15 g |
| 1-Methoxy-2-propanol | 5 g |
| Methyl alcohol | 7 g |

The structure of acid-generating agent [S-2] used in this example is shown below.

Acid-generating agent [S-2]

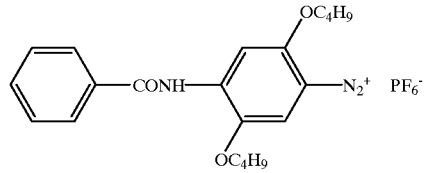

When the thus-obtained image-forming material [W-1] was used in thermal printing with a thermal head, the thermally printed portions developed a pink color. When the color-developed portions were scrubbed with water containing methanol, no change was observed.

Example 15

A solution [x] having the following composition was prepared, applied to a PET film, and dried for one minute at 100° C. to obtain a color image-forming material [X-1]. The amount of the coating film after drying was 1.0 g/m². The color of the film was green.

| Solution [x] | |
|---|---|
| Acid-generating agent [S-3] | 0.15 g |
| Polymer [BP-1] | 1.6 g |
| Thermal cross-linking agent [N-1] | 0.4 g |
| Infrared absorbing agent [K-1] | 0.1 g |
| Fluorine-type surfactant (Megafak F-177, Dainippon Ink and Chemicals, Inc.) | 0.06 g |
| Methyl ethyl ketone | 15 g |
| 1-Methoxy-2-propanol | 20 g |

The structure of acid-generating agent [S-3] used in this example is shown below.

Acid-generating agent [S-3]

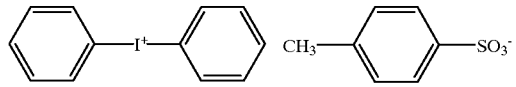

The thus-obtained image-forming material was exposed to a semiconductor laser which emitted infrared rays having a wavelength of 830–850 nm. The exposed portion developed a purple color. When the material was thermally treated for 15 seconds at 90° C. with a panel heater, the color density increased.

Example 16
Use as a Dry Planographic Film

A solution [Y] having the following composition was prepared, applied to a PET film, and dried for one minute at 100° C. to obtain a color image-forming material [Y-1]. The amount of the coating film after drying was 2.0 g/m². The color of the film was almost colorless.

| Solution [Y] | |
|---|---|
| Acid-generating agent [S-3] | 0.15 g |
| Polymer [BP-1] | 1.6 g |
| Thermal cross-linking agent [N-1] | 0.4 g |
| Fluorine-type surfactant (Megafak F-177, Dainippon Ink and Chemicals, Inc.) | 0.06 g |
| Methyl ethyl ketone | 15 g |
| 1-Methoxy-2-propanol | 5 g |

Subsequently, a solution of methyl ethyl ketone (10 g) and 1-methoxy-2-propanol (5 g) containing infrared absorbing agent [K-1] (0.2 g) and poly(benzyl methacrylate) (1.2 g) was applied to a PET film, and dried for one minute at 100° C. to thereby obtain a coating film [Y-2] which contained an infrared absorbing agent.

The thus-obtained [Y-1] and [Y-2] were stuck together so that the coated faces are in contact, to obtain a color-image-forming material [Y-3]. The resultant [Y-3] was exposed to a semiconductor laser which emitted infrared rays having a wavelength of 830–850 nm. After exposure, [Y-2] was separated, and color image was found to be formed on [Y-1].

A planographic printing plate material VPS manufactured by Fuji Photo Film Co., Ltd. was exposed to UV light under reduced pressure through [Y-1] that had color-developed images thereon. The exposed VPS was developed in a developing solution DP-4 (1:8 aqueous dilution, manufactured by Fuji Photo Film Co., Ltd.), rinsed with a rinsing liquid FR-3 (1:7), and surface-treated with gum GU-7 (1:1), and subjected to printing with a printer (Heidel KOR-D). A large number of excellent prints having stain free nonimage portions were obtained.

Example 17

In a manner similar to that used in the preparation of solution [v] in Example 12, a color image forming material [V-2] was prepared except that an [S-4] having the following structure was used as an acid-generating agent, and [BP-2] was used as a polymer. The resultant film was almost colorless.

Acid-generating agent [S-4]

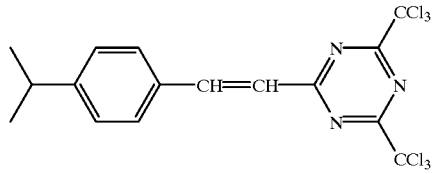

When the obtained image-forming material was exposed to UV rays, the exposed portions developed a blue color.

Example 18

In a manner similar to that used in the preparation of solution [w] in Example 14, a color image forming material [W-2] was prepared except that [BP-9] was used as a polymer. The resultant image-forming material [W-2]) was thermally printed with a thermal head. The thermally printed portions developed an orange color. When the color-developed portions were scrubbed with water containing methanol, no change was observed.

Example 19

A solution [Z] having the following composition was prepared, applied to a PET film, and dried for one minute at 100° C. to obtain a color image-forming material [Z-1]. The amount of the coating film after drying was 1.5 g/m².

| Solution [Z] | |
|---|---|
| Acid-generating agent [S-1] | 0.15 g |
| Polymer [BP-1] | 1.0 g |
| Thermal cross-linking agent [N-1] | 0.4 g |
| Poly(benzyl methacrylate) | 0.5 g |
| Fluorine-type surfactant (Megafak F-177, Dainippon Ink and Chemicals, Inc.) | 0.06 g |
| Methyl ethyl ketone | 15 g |
| 1-Methoxy-2-propanol | 5 g |
| Methyl alcohol | 7 g |

The structure of the thermal cross-linking agent [N-5] used in this example is shown below.

[N-5]

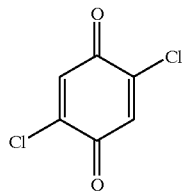

The thus-obtained image-forming material [Z-1] was exposed to ultraviolet rays. The exposed portion developed a bluish purple color.

Comparative Example 3

In a manner similar to that used in the preparation of solution [v] in Example 12, a color image forming material [T-1] was prepared except that an acid-generating agent [S-1] (i.e., component (C)) was omitted. The resultant material [T-1] was exposed to UV rays. No development of color was observed.

Comparative Example 4

In a manner similar to that used in the preparation of solution [v] in Example 12, a color image forming material [T-2] was prepared except that a thermal cross-linking agent [N-1] (i.e., component (B)) was omitted. The resultant material [T-2] was exposed to UV rays. No development of color was observed.

What is claim is:

1. A negative image recording material comprising:

(A) a polymer having an aromatic heterocyclic group containing an unsaturated bond therein, (B) a cross-linking agent that cross-links with the aid of an acid, and (C) a compound that generates an acid upon exposure to light or heat, wherein the polymer (A) is obtained through radical polymerization of at least one monomer represented by the following formula (II):

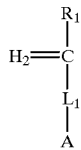

(II)

wherein $R_1$ represents a hydrogen atom or a methyl group; $L_1$ represents a single bond, an ester linkage, a carboxylic amide linkage, a sulfonic amide linkage, an ether linkage, a thioether linkage, or a divalent organic group having 20 or less carbon atoms and optionally containing these linkages; and A represents a heterocycle.

2. The negative image recording material according to claim 1, wherein the polymer is a polymer obtained through radical polymerization of at least one monomer represented by any one of the following formulas (VI) through (VIII):

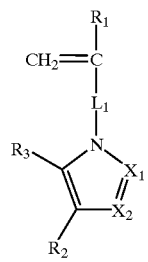

(VI)

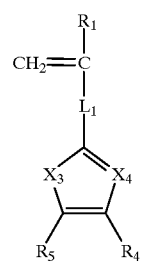

(VII)

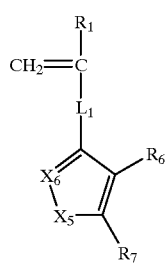

(VIII)

wherein $R_1$ represents a hydrogen atom or a methyl group; $L_1$ represents a single bond, an ester linkage, a carboxylic amide linkage, a sulfonic amide linkage, an ether linkage, a thioether linkage, or a divalent organic group having 20 or less carbon atoms and optionally containing these linkages; and each of $R_2$ to $R_7$, which may be identical to or different from one another, represents a hydrogen atom or an organic group having 20 or less carbon atoms and optionally containing a substituent; each of $X_1$ and $X_2$, which may be identical to or different from each other, represents a nitrogen atom or C-$R_{11}$; $R_{11}$ represents a hydrogen atom or a hydrocarbon group having 20 or less carbon atoms; $X_3$ represents N-$R_{12}$, an oxygen atom, or a sulfur atom; $R_{12}$ represents a hydrogen atom or a hydrocarbon group having 20 or less carbon atoms; $X_4$ represents a nitrogen atom or C-$R_{13}$; $R_{13}$ represents a hydrogen atom or a hydrocarbon group having 20 or less carbon atoms; $X_5$ represents N-$R_{14}$, an oxygen atom, or a sulfur atom, $R_{14}$ represents a hydrogen atom or a hydrocarbon group having 20 or less carbon atoms; $X_6$ represents a nitrogen atom or C-$R_{15}$, and $R_{15}$ represents a hydrogen atom or a hydrocarbon group having 20 or less carbon atoms.

3. The negative image recording material according to claim 2, wherein the polymer is a copolymer obtained through radical polymerization of at least one monomer represented by any one of the formulas (VI) through (VIII) and an acidic functional group containing monomer.

4. The negative image recording material according to claim 2, wherein the polymer is a copolymer obtained through radical polymerization of at least one monomer represented by any one of the formulas (VI) through (VIII) and a monomer containing an ammonium salt or a metal salt of a strong acid.

5. The negative image recording material according to claim 2, wherein the content of monomer unit represented by said any one of the formulas (VI) through (VIII) in the copolymer is 20–100% by weight with respect to the weight of the polymer.

6. The negative image recording material according to claim 1, wherein the weight average molecular weight of the polymer is not less than 5,000 and number average molecular weight thereof is not less than 1,000.

7. The negative image recording material according to claim 1, wherein the content of the polymer is 20–95% by weight with respect to the total weight of the solid components contained in the image recording material.

8. The negative image recording material according to claim 1, wherein the cross-linking agent is at least one member selected from the group consisting of methylol melamine, resol resins, epoxidized novolak resin and urea resins.

9. The negative image recording material according to claim 1, wherein the amount of the cross-linking agent contained in the image recording material is 5–70% by weight with respect to the total weight of the solid components contained in the image recording material.

10. The negative image recording material according to claim 1, wherein the compound that generates an acid upon exposure to light or heat is at least one species of onium salt selected from the group consisting of iodonium salts, sulfonium salts, phosphonium salts, and diazonium salts.

11. The negative image recording material according to claim 1, wherein the compound that generates an acid upon exposure to light or heat is contained in an amount of 0.01–50% by weight with respect to the total weight of the solid components of the image recording material.

12. The negative image recording material according to claim 1, which further contains an infrared absorber as a spectral sensitizer.

13. The negative image recording material according to claim 12, wherein the infrared absorbing agent is a dye or pigment having maximum absorption in a wavelength range from 760 nm to 1,200 nm.

14. The negative image recording material according to claim 13, wherein the dye is at least one member selected from the group consisting of cyanine dyes, squarylium dyes, pyrylium salts, and metal thiolato complexes.

15. The negative image recording material according to claim 13, wherein the pigment is carbon black.

16. The negative image recording material according to claim 12, wherein the infrared absorbing agent is contained in an amount of 0.01–50% by weight with respect to the total weight of the solid components of the image recording material.

17. A negative image recording material comprising:

(A) a polymer having a heterocyclic group containing an unsaturated bond therein, (B) a cross-linking agent that cross-links with the aid of an acid, and (C) a compound that generates an acid upon exposure to light or heat; wherein the cross-linking agent is at least one carbonyl compound that reacts with the compound (A) to form a dye skeleton in the presence of an acid or an equivalent of the carbonyl compound.

18. The negative image recording material according to claim 17, wherein the carbonyl compound is at least one member selected from the group consisting of aldehydes, ketones, quinones, and acetals.

19. The negative image recording material according to claim 17, wherein the equivalent of the carbonyl compound is at least one member selected from the group consisting of imines and amidines.

* * * * *